US009985088B2

(12) United States Patent
Edelstein et al.

(10) Patent No.: US 9,985,088 B2
(45) Date of Patent: May 29, 2018

(54) METAL RESISTORS HAVING NITRIDIZED METAL SURFACE LAYERS WITH DIFFERENT NITROGEN CONTENT

(71) Applicant: International Business Machines Corporation, Armonk, NY (US)

(72) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/132,796

(22) Filed: Apr. 19, 2016

(65) Prior Publication Data

US 2017/0301747 A1    Oct. 19, 2017

(51) Int. Cl.
*H01L 49/02* (2006.01)
*H01L 27/01* (2006.01)
(Continued)

(52) U.S. Cl.
CPC ........ *H01L 28/24* (2013.01); *H01L 21/02697* (2013.01); *H01L 21/62* (2013.01);
(Continued)

(58) Field of Classification Search
CPC .............................. H01L 27/016; H01L 28/24
See application file for complete search history.

(56) References Cited

U.S. PATENT DOCUMENTS 4,760,369 A    7/1988  Tiku
6,207,560 B1   3/2001  Lee
(Continued)

FOREIGN PATENT DOCUMENTS

CN         104361967 A      2/2015

OTHER PUBLICATIONS

Wilks, J. A., et al. "Nitridation of organo-silicate glass: A self-limiting process for PVD Ta1+xN/Ta barrier formation", Applied Surface Science, Aug. 2009, pp. 9543-9547, 255(23).
(Continued)

*Primary Examiner* — Daniel Luke
(74) *Attorney, Agent, or Firm* — Scully, Scott, Murphy & Presser, P.C.; Steven J. Meyers

(57) ABSTRACT

A semiconductor structure containing at least two metal resistor structures having different amounts of nitrogen on the resistor surface is provided. The resulted resistances (and hence resisitivty) of the two metal resistors can be either the same or different. The semiconductor structure may include a first metal resistor structure located on a portion of a dielectric-containing substrate. The first metal resistor structure includes, from bottom to top, a first metal layer portion and a first nitridized metal surface layer having a first nitrogen content. The semiconductor structure further includes a second metal resistor structure located on a second portion of the dielectric-containing substrate and spaced apart from the first metal resistor structure. The second metal resistor structure includes, from bottom to top, a second metal layer portion and a second nitridized metal surface layer having a second nitrogen content that differs from the first nitrogen content.

11 Claims, 6 Drawing Sheets

(51) Int. Cl.
  *H01L 21/66* (2006.01)
  *H01L 21/02* (2006.01)
  *H01L 21/62* (2006.01)
  *H01L 23/522* (2006.01)
  *H01L 21/768* (2006.01)

(52) U.S. Cl.
  CPC ........ *H01L 21/76892* (2013.01); *H01L 22/14* (2013.01); *H01L 22/20* (2013.01); *H01L 23/5228* (2013.01); *H01L 27/016* (2013.01)

(56) References Cited

U.S. PATENT DOCUMENTS

| | | | |
|---|---|---|---|
| 6,232,042 | B1 | 5/2001 | Dunn et al. |
| 8,013,394 | B2 | 9/2011 | Chinthakindi et al. |
| 8,400,257 | B2 | 3/2013 | Lim et al. |
| 8,420,531 | B2 | 4/2013 | Yang |
| 8,426,745 | B2 | 4/2013 | Gaul et al. |
| 9,243,321 | B2 | 1/2016 | Tendulkar |
| 2003/0178396 | A1* | 9/2003 | Naumov .............. H01C 17/242 219/121.69 |
| 2004/0027234 | A1 | 2/2004 | Hashimoto et al. |
| 2006/0290462 | A1* | 12/2006 | Beach ...................... H01C 1/14 338/9 |
| 2008/0213927 | A1 | 9/2008 | Wang et al. |
| 2012/0313220 | A1* | 12/2012 | Yang .................. H01L 23/5228 257/537 |
| 2014/0008764 | A1 | 1/2014 | Yang et al. |

OTHER PUBLICATIONS

Scandurra, A., et al., "Tantalum nitride thin film resistors by low temperature reactive sputtering for plastic electronics", Surface and Interface Analysis, Mar.-Apr. 2008.
pp. 758-762, vol. 40, Issue 3-4.
List of IBM Patents or Patent Applications Treated As Related dated Apr. 19, 2016, 2 pages.

\* cited by examiner

METAL RESISTORS HAVING NITRIDIZED METAL SURFACE LAYERS WITH DIFFERENT NITROGEN CONTENT

BACKGROUND

The present application relates to a semiconductor structure and a method of forming the same. More particularly, the present application relates to a semiconductor structure containing at least a first metal resistor structure having a first nitrogen content and a second metal resistor structure having a second nitrogen content that differs from the first nitrogen content, and a method of forming such a semiconductor structure.

A resistor is one of the most common electrical components, and is used in almost every electrical device. In semiconductor device fabrication, it is well known to have thin film resistors embedded in the back-end-of-line (BEOL) structures of the chip through either a damascene approach or a subtractive etch method. BEOL thin film resistors are generally preferred over other types of resistors because of the lower parasitic capacitance. Conventional resistor materials and fabrication methods, however, present a number of challenges.

In one approach, the sheet resistivity of various resistors formed over an entire wafer may vary and go beyond specifications due to poor process control. In an advanced manufacturing line, wafers out of specification are often scrapped for quality control, which is expensive.

One material used for resistors is doped polysilicon. A problem with this conventional resistor material is that it can only provide a limited resistance within a limited dimension, which presents problems as further miniaturization of the device features continues. Resistive thin films such as chromium silicide (CrSi) and tantalum nitride (TaN) are also used as resistors in semiconductor devices. Prior art metal nitride resistors such as TaN are generally formed by physical vapor deposition and as such the nitrogen content within such resistors is less than 50 atomic percent. Manufacturing metal nitride resistors having a nitrogen content that is greater than 50 atomic percent, %, nitrogen is not possible using prior art deposition techniques due to nitrogen poison related problems which are inherently present in such deposition processes.

SUMMARY

In one aspect of the present application, a semiconductor structure containing at least two metal resistor structures having different amounts of nitrogen on the resistor surface is provided. The resulted resistances (and hence resisitivty) of the two metal resistors can be either the same or different. In one embodiment of the present application, the semiconductor structure may include a first metal resistor structure located on a portion of a dielectric-containing substrate. The first metal resistor structure includes, from bottom to top, a first metal layer portion and a first nitridized metal surface layer having a first nitrogen content. The semiconductor structure further includes a second metal resistor structure located on a second portion of the dielectric-containing substrate and spaced apart from the first metal resistor structure. The second metal resistor structure includes, from bottom to top, a second metal layer portion and a second nitridized metal surface layer having a second nitrogen content that differs from the first nitrogen content.

In another aspect of the present application, a method of forming a semiconductor structure containing at least two metal resistor structures having different amounts of nitrogen on the resistor surface is provided. The resulted resistances (and hence resisitivty) of the two metal resistors can be either the same or different. In one embodiment, the method may include providing a dielectric-containing substrate including at least an interconnect dielectric material layer. Next, a first metal layer portion is formed on a first portion of a topmost surface of the interconnect dielectric material layer, and a second metal layer portion is also formed on a second portion of the topmost surface of the interconnect dielectric material layer. A first nitridation process is then performed to provide a first nitridized metal surface layer having a first nitrogen content within the first metal layer portion, wherein the first metal layer portion and the first nitridized metal surface layer provide a first metal resistor structure. Next, a second nitridation process is performed to provide a second nitridized metal surface layer having a second nitrogen content that differs from the first nitrogen content within the second metal layer portion, wherein the second metal layer portion and the second nitridized metal surface layer provide a second metal resistor structure.

DETAILED DESCRIPTION

Figure 1:
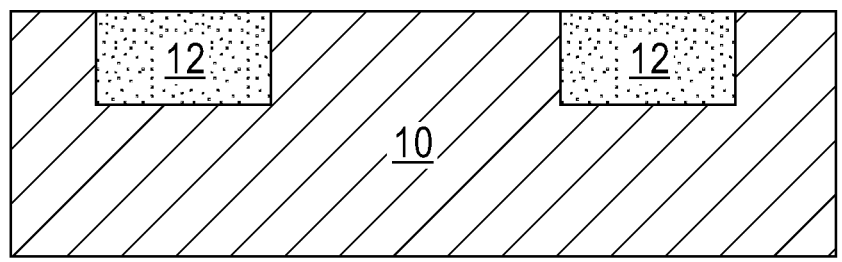
FIG. 1 is a cross sectional view of an exemplary semiconductor structure including at least one conductive region embedded in a base interconnect dielectric material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including at least one conductive region 12 embedded in a base interconnect dielectric material layer 10 that can be employed in accordance with an embodiment of the present application. By "embedded" it is meant that are least a portion of each conductive region 12 is contained between a topmost surface and a bottommost surface of the base interconnect dielectric material layer 10. In some embodiments, and as shown, the topmost surface of each conductive region 12 is coplanar with a topmost surface of the base interconnect dielectric material 10 and a bottommost surface of the each conductive region 12 is located between the topmost surface and the bottommost surface of the base interconnect dielectric material layer 10.

The base interconnect dielectric material layer 10 may be located upon a substrate (not shown in the drawings of the present application). The substrate, which is not shown, may be composed of a semiconducting material, an insulating material, a conductive material or any combination thereof. When the substrate is composed of a semiconducting material, any material having semiconductor properties such as, for example, Si, SiGe, SiGeC, SiC, Ge alloys, III/V compound semiconductors or II/VI compound semiconductors, may be used. In addition to these listed types of semiconducting materials, the substrate that is located beneath the base interconnect dielectric material layer 10 can be a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or any combination thereof including multilayers. When the substrate is a conductive material, the substrate may include, for example, polySi, an elemental metal, alloys of elemental metals, a metal silicide, a metal nitride or any combination thereof including multilayers. When the substrate is composed of a semiconducting material, one or more semiconductor devices such as, for example, complementary metal oxide semiconductor (CMOS) devices can be fabricated thereon. When the substrate is composed of a combination of an insulating material and a conductive material, the substrate may represent an underlying interconnect level of a multilayered interconnect structure.

The base interconnect dielectric material layer 10 that is employed in the present application may be composed of any interlevel or intralevel dielectric including inorganic dielectrics or organic dielectrics. In one embodiment, the base interconnect dielectric material layer 10 may be non-porous. In another embodiment, the base interconnect dielectric material layer 10 may be porous. Some examples of suitable dielectrics that can be used as the base interconnect dielectric material layer 10 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The base interconnect dielectric material layer 10 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the base interconnect dielectric material layer 10 may vary depending upon the type of dielectric material (s) used. In one example, the base interconnect dielectric material layer 10 may have a thickness from 50 nm to 1000 nm. Other thicknesses that are lesser than, or greater than, the aforementioned thickness range may also be employed in the present application for the thickness of the base interconnect dielectric material layer 10.

As stated above, at least one conductive region 12 is embedded in the base interconnect dielectric material layer 10. The at least one conductive region 12 can be formed by first providing at least one opening into the base interconnect dielectric material layer 10, and then filling the at least one opening with a conductive material.

The at least one opening that is formed into the base interconnect dielectric material layer 10 can be formed utilizing a patterning process. In one embodiment, the patterning process may include lithography and etching. The lithographic process includes forming a photoresist (not shown) atop the base interconnect dielectric material layer 10, exposing the photoresist to a desired pattern of radiation and developing the exposed photoresist utilizing a conventional resist developer. The photoresist may be a positive-tone photoresist, a negative-tone photoresist or a hybrid-tone photoresist. In some embodiments, a hard mask such as, for example, a layer of silicon dioxide and/or silicon nitride, can be interposed between the photoresist and the base interconnect dielectric material layer 10. The etching process includes a dry etching process (such as, for example, reactive ion etching, ion beam etching, plasma etching or laser ablation), and/or a wet chemical etching process. Typically, reactive ion etching is used in providing the at least one opening into at least the base interconnect dielectric material layer 10. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying base interconnect dielectric material layer 10.

The depth of the at least one opening that is formed into the base interconnect dielectric material layer 10 (measured from the topmost surface of the base interconnect dielectric material layer 10 to the bottom wall of the at least one opening) may vary. In some embodiments, the at least one opening may extend entirely through the base interconnect dielectric material layer 10. In yet other embodiments, the at least one opening stops within the base interconnect dielectric material layer 10 itself. In yet further embodiments, different depth openings can be formed into the base interconnect dielectric material layer 10.

The at least one opening that is formed into the base interconnect dielectric material layer 10 may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 1, and by way of an example, the at least one opening that houses the at least one conductive region 12 is shown as a line opening. When a via or line is formed, a single damascene process (including the above mentioned lithography and etching steps) can be employed. When a combined via/line is formed a dual damascene process (including at least one iteration of the above mentioned lithography and etching steps) can be employed.

Next, a diffusion barrier (not show) can be optionally formed within the at least one opening and atop the base interconnect dielectric material layer 10. The diffusion barrier includes Ta, TaN, Ti, TiN, Ru, RuN, RuTa, RuTaN, W, WN or any other material that can serve as a barrier to prevent a conductive material from diffusing there through. The thickness of the diffusion barrier may vary depending on the deposition process used as well as the material employed. In some embodiments, the diffusion barrier may have a thickness from 2 nm to 50 nm; although other thicknesses for the diffusion barrier material are contemplated and can be employed in the present application. The diffusion barrier can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier. In cases in which the conductive material to be subsequently and directly formed on the diffusion barrier, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

A conductive material (which after deposition and planarization forms the at least one conductive region 12 shown in FIG. 1) is then formed within the at least one opening and atop the base interconnect dielectric material layer 10. The conductive material may be composed of polySi, SiGe, a conductive metal, an alloy comprising at least one conductive metal, a conductive metal silicide or combinations thereof. In one embodiment, the conductive material is a conductive metal such as Cu, W or Al. In another embodiment, the conductive material is Cu or a Cu alloy (such as AlCu). The conductive material may be formed by a deposition process including chemical vapor deposition (CVD), plasma enhanced chemical vapor deposition (PECVD), sputtering, chemical solution deposition or plating. In one embodiment, a bottom-up plating process is employed in forming the conductive material of the at least one conductive region 12.

Following the deposition of the conductive material, a planarization process such as, for example, chemical mechanical polishing (CMP) and/or grinding, can be used to remove all conductive material (i.e., overburden material) that is present outside the at least one opening forming the at least one conductive region 12 embedded within the base interconnect dielectric material layer 10. The planarization stops on a topmost surface of the base interconnect dielectric material layer 10 providing the coplanar structure illustrated in FIG. 1. If a diffusion barrier and an optional plating seed layer are present, the planarization process would provide a U-shaped diffusion barrier and a U-shaped plating seed layer within the at least one opening. The U-shaped diffusion barrier and the U-shaped plating seed layer would be interposed between the base interconnect dielectric material layer 10 and the at least one conductive region 12. Also, the U-shaped diffusion barrier and the U-shaped plating seed layer would each have a topmost surface that is coplanar with a topmost surface of both the base interconnect dielectric material layer 10 and the at least one conductive region 12.

Figure 2:
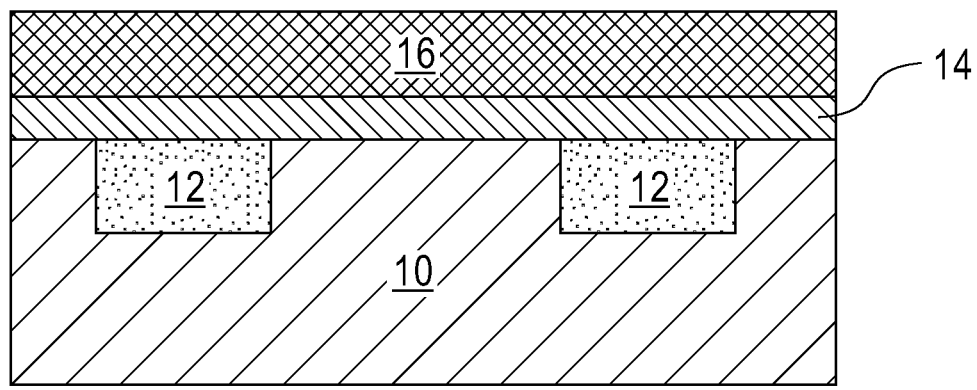
FIG. 2 is a cross sectional view of the exemplary semiconductor structure of FIG. 1 after forming a dielectric stack of, from bottom to top, a base dielectric capping layer and an interconnect dielectric material layer.

Referring now to FIG. 2, there is illustrated the exemplary semiconductor structure of FIG. 1 after forming a dielectric stack of, from bottom to top, a base dielectric capping layer 14 and an interconnect dielectric material layer 16. In some embodiments of the present application, the base dielectric capping layer 14 may be omitted such that the interconnect dielectric material layer 16 is formed directly upon the base interconnect dielectric material layer 10. Collectively, the base interconnect dielectric material layer 10, if present, the base dielectric capping layer 14, and the interconnect dielectric material layer 16 are dielectric components of a dielectric-containing substrate of the present application.

When present, the base dielectric capping layer 14 is formed on the exposed topmost surfaces of the base interconnect dielectric material layer 10 and the at least one conductive region 12. The base dielectric capping layer 14 can include any suitable dielectric capping material such as, for example, SiC, $Si_4NH_3$, $SiO_2$, a carbon doped oxide, a nitrogen and hydrogen doped silicon carbide SiC(N,H) or multilayers thereof. The base dielectric capping layer 14 can be formed utilizing a conventional deposition process such as, for example, chemical vapor deposition, plasma enhanced chemical vapor deposition, chemical solution deposition, evaporation, or atomic layer deposition. The thickness of the base dielectric capping layer 14 may vary depending on the technique used to form the same as well as the material make-up of the layer. Typically, the base dielectric capping layer 14 has a thickness from 15 nm to 100 nm. Other thicknesses that are lesser than, or greater than the aforementioned thickness range may also be employed as the thickness of the base dielectric capping layer 14.

The interconnect dielectric material layer 16 may be composed of one of the dielectric materials mentioned above for the base interconnect dielectric material layer 10; the interconnect dielectric material layer 16 can be referred to as a second interconnect dielectric material layer, while the base interconnect dielectric material layer 10 may be referred to as a first interconnect dielectric material layer.

In one embodiment, the interconnect dielectric material layer 16 is composed of a same dielectric material as the base interconnect dielectric material layer 10. In another embodiment, the interconnect dielectric material layer 16 is composed of a different dielectric material than the base interconnect dielectric material layer 10. The interconnect dielectric material layer 16 can be formed utilizing one of the deposition processes mentioned above for forming the base interconnect dielectric material layer 10, and the thickness of the interconnect dielectric material layer 16 is within the range mentioned above for the base interconnect dielectric material layer 10.

Figure 3:
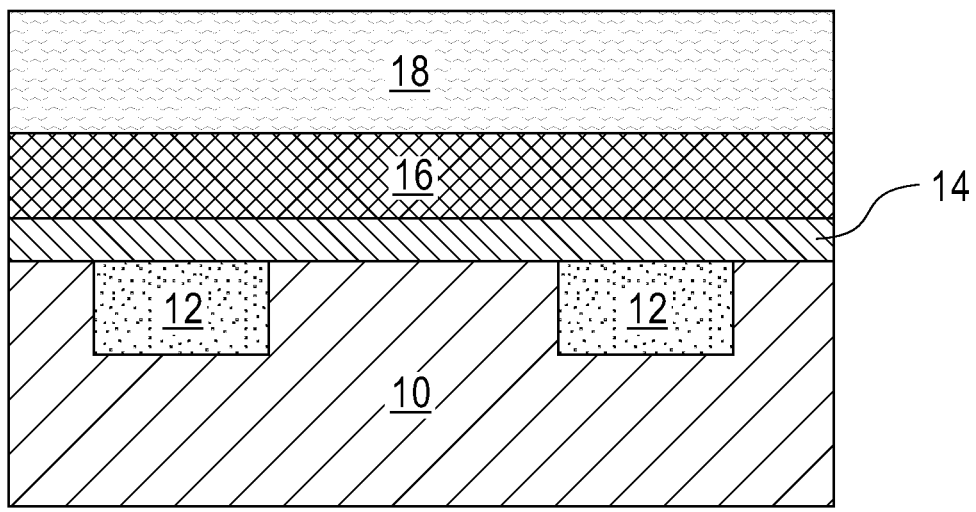
FIG. 3 is cross sectional view of the exemplary semiconductor structure of FIG. 2 after forming a metal layer over the dielectric stack.

Referring now to FIG. 3, there is illustrated the exemplary semiconductor structure of FIG. 2 after forming a metal layer 18 over the dielectric stack (14, 16). The metal layer 18 is a continuous layer that is formed over the entirety of the dielectric stack (14, 16). As is shown, a bottommost surface of the metal layer 18 is formed directly upon a topmost surface of the interconnect dielectric material layer 16.

The metal layer 18 that is formed in the present application includes, but is not limited to, TaN, Ta, TiN, Ta, RuN, Ru, CoN, Co, WN, W, TaRuN and/or TaRu. The metal layer 18 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The metal layer 18 that is formed typically has a thickness from 2 nm to 50 nm, although other thicknesses are not excluded.

Figure 4:
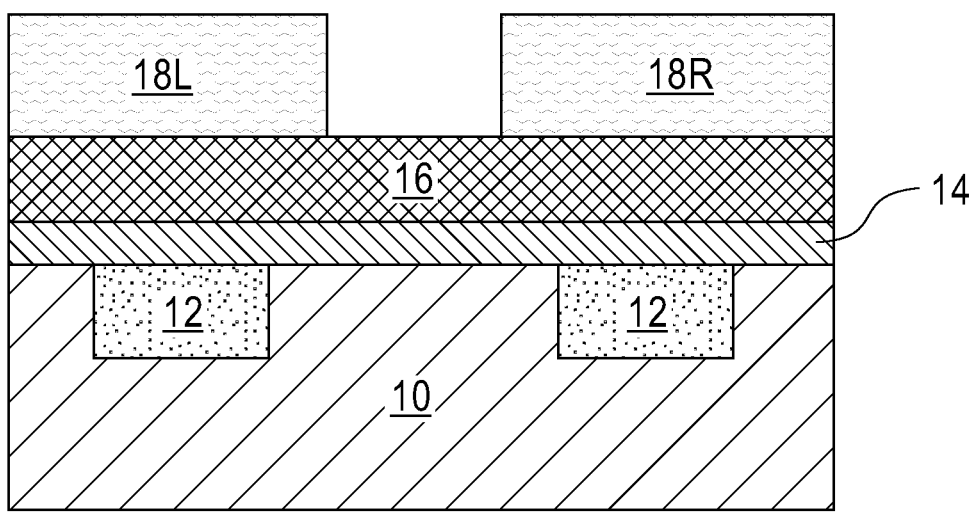
FIG. 4 is a cross sectional view of the exemplary semiconductor structure of FIG. 3 after patterning the metal layer to provide at least a first metal layer portion and a second metal layer portion that are spaced apart from each other.

Referring now to FIG. 4, there is illustrated the exemplary semiconductor structure of FIG. 3 after patterning the metal layer 18 to provide at least a first metal layer portion 18L and a second metal layer portion 18R that are spaced apart from each other. The first metal layer portion 18L is located in a first region of the dielectric-containing substrate of the present application, while the second metal layer portion 18R is located in a second region of the dielectric-containing substrate of the present application. Although the present application describes and illustrates, two metal layer portions (18L, 18R), a plurality of metal layer portions can be formed at this step of the present application.

In one embodiment of the present application, the patterning of the metal layer 18 can be performed utilizing lithography and etching as mentioned above in forming the at least one conductive region 12.

At this point of the present application, resistance measurements can be performed on the individual metal layer portions that are provided by the patterning of the metal layer 18. In one example, resistance measurements can be performed on the first metal layer portion 18L and the second metal layer portion 18R. The resistance of the individual metal layer portions (e.g., 18L, 18R) can be performed utilizing any conventional technique that is capable of measuring the resistance of a material. In one example, a four point probe resistivity measurement can be used to measure the resistance of each individual metal layer portion. In some embodiments and when the resistance measurements of the individual metal layer portions is not within a pre-determined range, trimming of the individual metal layer portions can be performed utilizing another patterning process. The steps of resistance measuring and trimming may be repeated any number of times to arrive at the pre-determined range. Based on the resistance measurements, one can determine how much nitrogen is needed to be added during the subsequently performed nitridation processes. That is, the measured resistance provides information on a content of nitrogen to be used during the first and second nitridation processes.

Figure 5:
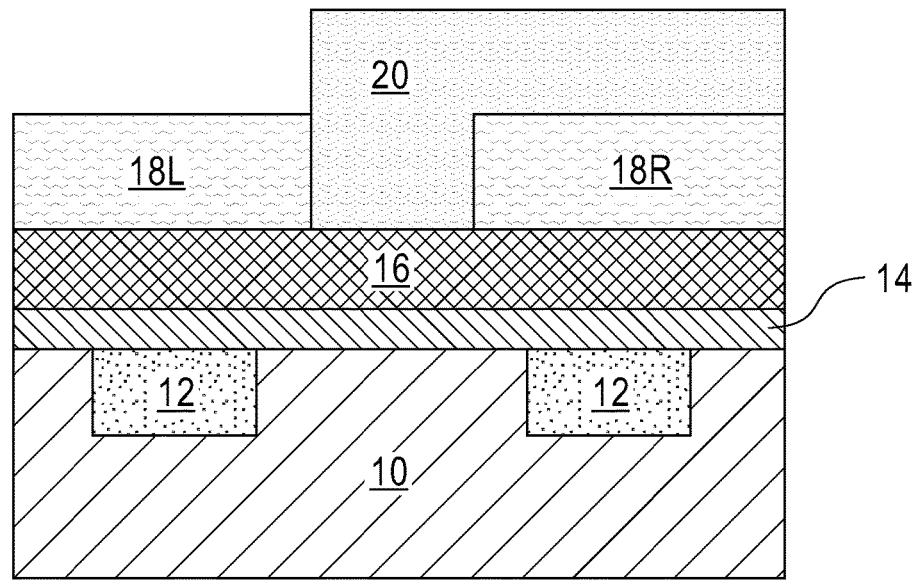
FIG. 5 is a cross sectional view of the exemplary semiconductor structure of FIG. 4 after forming a first block mask over the second metal layer portion, while leaving the first metal layer portion exposed for further processing.

Referring now to FIG. 5, there is illustrated the exemplary semiconductor structure of FIG. 4 after forming a first block mask 20 over the second metal layer portion 18R, while leaving the first metal layer portion 18L exposed for further processing.

The first block mask 20 may be any suitable block mask material which prevents nitrogen diffusion therethrough. Examples of suitable block mask materials that can be employed in the present application include, for example, a photoresist material (as mentioned above), a dielectric hard mask material (as mentioned above), or a combination of, from bottom to top, a dielectric hard mask material and a photoresist material. The first block mask 20 can be formed by first depositing a blanket layer of a block mask material. The block mask material may be deposited by chemical vapor deposition, plasma enhanced chemical vapor deposition, physical vapor deposition, spin-on coating or any combination thereof. Following the deposition of the blanket layer of block mask material, the blanket layer of block mask material is patterned. In some embodiments, patterning of the blanket layer of block mask material may include lithography only. Such an embodiment is employed when the blanket layer of block mask material consists only of a photoresist material. In other embodiments, patterning of the blanket layer of block mask material may include lithography, followed by an etch. Such an embodiment may be employed when the blanket layer of block mask material consists of only a hard mask material or a hard mask material/photoresist material stack.

The first block mask 20 has a thickness that is sufficient to prevent nitrogen diffusion therethrough. In one embodiment of the present application, the first block mask 20 has a thickness from 25 nm to 200 nm. Other thicknesses that are lesser than, or greater than the aforementioned range can be employed so long as the thickness of the first block mask 20 is sufficient to prevent nitrogen diffusion therethrough.

Figure 6:
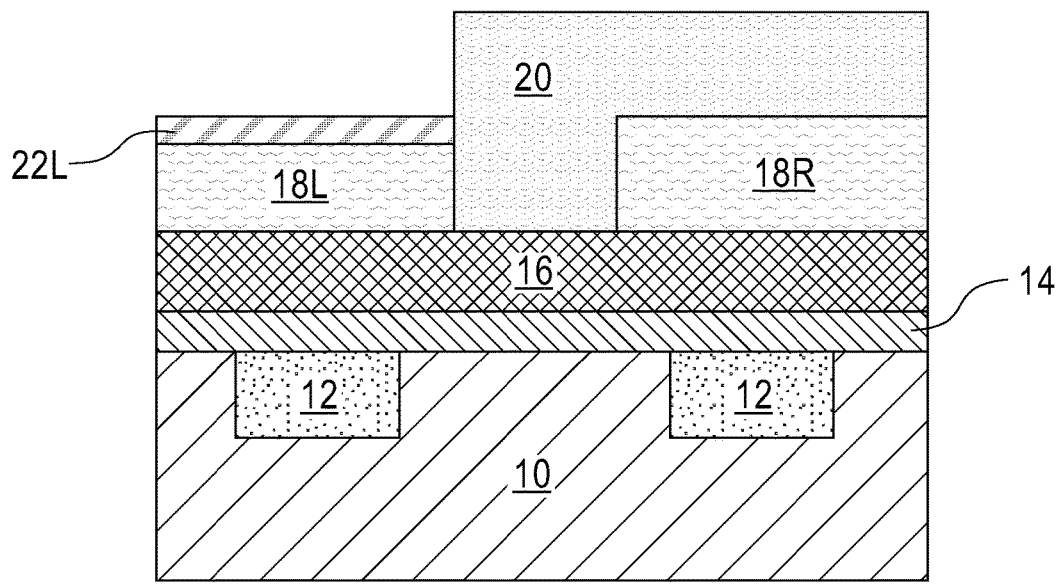
FIG. 6 is a cross sectional view of the exemplary semiconductor structure of FIG. 5 after performing a first nitridation process to form a first nitridized metal surface layer having a first nitrogen content.

Referring now to FIG. 6, there is illustrated the exemplary semiconductor structure of FIG. 5 after performing a first nitridation process to form a first nitridized metal surface layer 22L having a first nitrogen content; no nitridation occurs in the region of the exemplary semiconductor structure that is protected by the first block mask 20. The first nitridized metal surface layer 22L is formed within a surface of the first metal layer portion 18L.

The first nitridation process may also be referred to herein as a first nitride surface treatment process. The first nitridized metal surface layer 22L may also be referred to herein as a first nitrogen enriched metal surface layer. By "nitrogen enriched metal surface layer" it is meant, that the exposed upper surface of the metal layer portion has a higher nitrogen content therein after performing the nitridation process as compared to the originally deposited metal layer 18.

In one embodiment, the first nitridation process used in forming the first nitridized metal surface layer 22L is a thermal nitridation process. The thermal nitridation process that is employed in the present application does not include an electrical bias higher than 200 W. In some embodiments, no electrical bias is performed during the thermal nitridation process. The thermal nitridation process employed in the present application is performed in any nitrogen-containing ambient, which is not in the form of a plasma. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient.

Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical. In one embodiment, the thermal nitridation process employed in the present application is performed at a temperature from 50° C. to 450° C. In another embodiment, the thermal nitridation process employed in the present application is performed at a temperature from 100° C. to 300° C.

In addition to a thermal nitridation process, the formation of the first nitridized metal surface layer 22L can include a plasma nitridation process. When a plasma nitridation process is employed, an electrical bias of greater than 200 W can be employed. The plasma nitridation process is performed by generating a plasma from one of the nitrogen-containing ambients that is mentioned above for the thermal nitridation process. In one embodiment, the plasma nitridation process employed in the present application is performed at a temperature from 50° C. to 450° C. In another embodiment, the plasma nitridation process employed in the present application is performed at a temperature from 100° C. to 300° C.

Notwithstanding the type of nitridation employed, the depth of the first nitridized metal surface layer 22L may vary. Typically, the depth of the first nitridized metal surface layer 22L, as measured from the topmost exposed surface of the first metal layer portion 18L inward, is from 0.5 nm to 20 nm, with a depth from 1 nm to 10 nm being more typical.

The first nitridized metal surface layer 22L is composed of a same metal as the first metal layer portion 18L with added nitrogen. In some embodiments, the first nitrogen content (which is a combination of added nitrogen plus any nitrogen that may be present in the metal layer 18) of the first nitridized metal surface layer 22L is 10 atomic percent or greater. In one embodiment of the present application, the first nitrogen content of the first nitridized metal surface layer 22L can be from 10 atomic percent nitrogen to 50 atomic percent nitrogen. Nitrogen contents of less than 10 atomic percent are also contemplated. When the metal layer 18 and hence the first metal layer portion 18L include a metal nitride, a nitrogen gradient may be formed between the first metal layer portion 18L and the first nitridized metal surface layer 22L.

The thickness of the first nitridized metal surface layer 22L is the same as the depth mentioned above. That is, the first nitridized metal surface layer 22L may, for example, have a thickness from 0.5 nm to 20 nm. Collectively, the first metal portion 18L and the first nitridized metal surface layer 22L provide a first metal resistor structure of the present application.

At this point of the present application, resistance measurements can be performed on the first metal resistor structure (18L, 22L). The resistance of the first metal resistor structure (18L, 22L) can be measured utilizing any conventional technique that is capable of measuring the resistance of a material or a material stack. In one example, a four point probe resistivity measurement can be used to measure the resistance of the first metal resistor structure (18L, 22L). In some embodiments and when the resistance measurements of the first metal resistor structure (18L, 22L) is not within a pre-determined range, trimming of the individual first metal resistor structure (18L, 22L) can be performed utilizing a patterning process. The steps of resistance measuring and trimming may be repeated any number of times to arrive at the pre-determined range.

Figure 7:
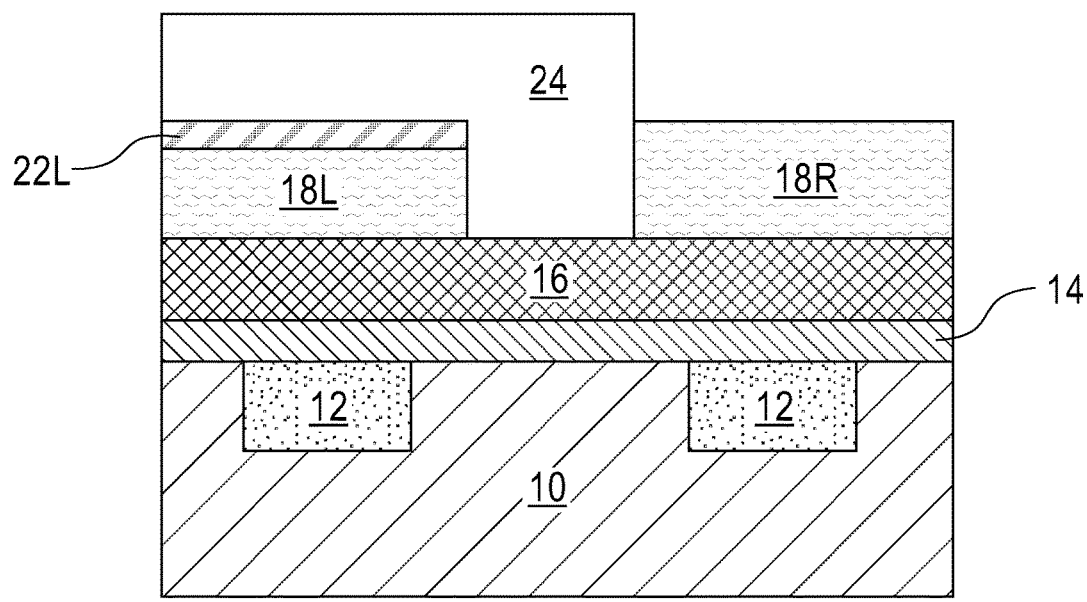
FIG. 7 is a cross sectional view of the exemplary semiconductor structure of FIG. 6 after removing the first block mask and forming a second block mask atop the first nitridized metal surface layer.

Referring now to FIG. 7, there is illustrated the exemplary semiconductor structure of FIG. 6 after removing the first block mask 20 and forming a second block mask 24 atop the first nitridized metal surface layer 22L. The first block mask 20 can be removed utilizing techniques well known in the art. For example, the first block mask 20 may be removed by ashing, planarization (such as, for example, chemical mechanical polishing) and/or etching.

The second block mask 24 is formed on the first nitridized metal surface layer 22L, while leaving the second metal layer portion 18R exposed and available for further processing. In the present application, the location of first block mask formation and second block mask formation may be reversed such that the second metal layer portion 18R is processed prior to the first metal layer portion 18L.

The second block mask 24 may include one of the block mask materials mentioned above for the first block mask 20. The second block mask 24 may be formed utilizing the technique(s) mentioned above in forming the first block mask 20. The second block mask 24 may have a thickness in the range mentioned above for the first block mask 20.

Figure 8:
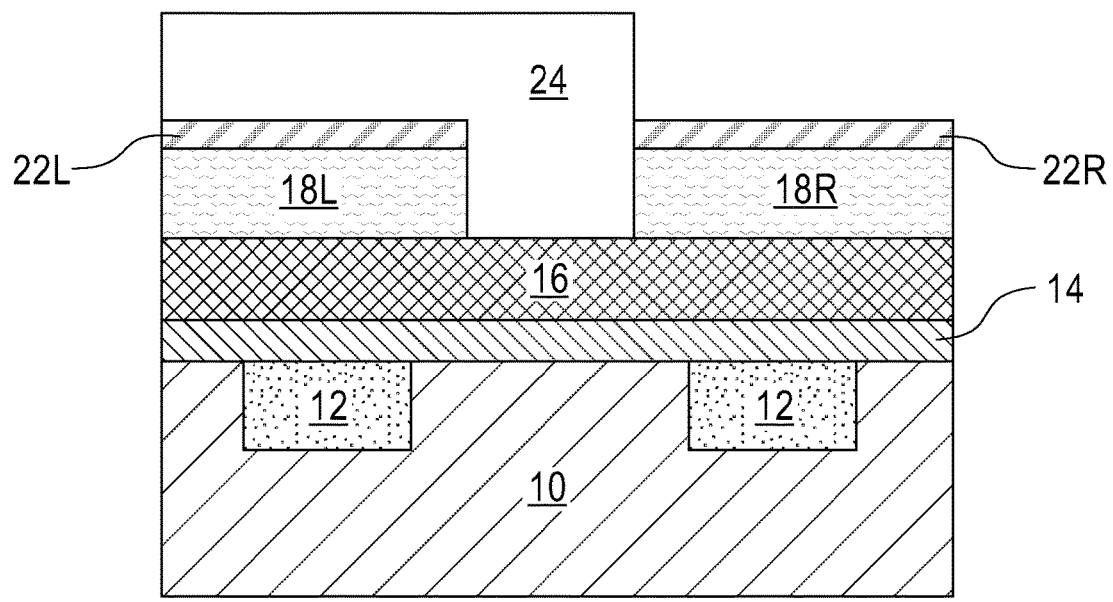
FIG. 8 is a cross sectional view of the exemplary semiconductor structure of FIG. 7 after performing a second nitridation process to form a second nitridized metal surface layer having a second nitrogen content that differs from the first nitrogen content.

Referring now to FIG. 8, there is illustrated the exemplary semiconductor structure of FIG. 7 after performing a second nitridation process to form a second nitridized metal surface layer 22R having a second nitrogen content that differs from the first nitrogen content; no nitridation occurs in the region of the exemplary semiconductor structure that is protected by the second block mask 24. The second nitridized metal surface layer 22R is formed within a surface of the second metal layer portion 18R.

The second nitridized metal surface layer 22R is composed of a same metal as the second metal layer portion 18R with added nitrogen. In one embodiment of the present application, the second nitrogen content (which is a combination of added nitrogen plus any nitrogen that may be present in the metal layer 18) is greater than the first nitrogen content. In another embodiment, the second nitrogen content is less than the first nitrogen content. In one embodiment, the second nitrogen content is 10 atomic percent or greater. In one example of the present application, the second nitrogen content of the second nitridized metal surface layer 22R can be from 10 atomic percent nitrogen to 80 atomic percent nitrogen. A nitrogen content of less than 10 atomic percent is also contemplated. In the present application, at least one of the first and second nitrogen contents may be 10 atomic percent or greater. Typically, but not always, both the first and second nitrogen contents are 10 atomic percent or greater. When the metal layer 18 and hence the second metal layer portion 18R include a metal nitride, a nitrogen gradient may be formed between the second metal layer portion 18R and the second nitridized metal surface layer 22R.

The second nitridation process may also be referred to herein as a second nitride surface treatment process. The second nitridized metal surface layer 22R may also be referred to herein as a second nitrogen enriched metal surface layer. The term "nitrogen enriched metal surface layer" has the same meaning as defined above.

In one embodiment, the second nitridation process used in forming the second nitridized metal surface layer 22R is a thermal nitridation process. The thermal nitridation process that may be employed as the second nitridation process is the same as defined above provided that the conditions are chosen to ensure that the content of nitrogen added to the second metal layer portion 18R differs from the content of nitrogen added in the first metal layer portion 18L. In one example, the nitrogen-containing ambient used in the first nitridation process comprises a different nitrogen content than the nitrogen-containing ambient used in the second nitridation process.

In another embodiment, the second nitridation process used in forming the second nitridized metal surface layer 22R is a plasma nitridation process. The plasma nitridation process that may be employed as the second nitridation process is the same as defined above provided that the conditions are chosen to ensure that the content of nitrogen added to the second metal layer portion 18R differs from the content of nitrogen added in the first metal layer portion 18L. In one example, the nitrogen-containing ambient used in the first nitridation process comprises a different nitrogen content than the nitrogen-containing ambient used in the second nitridation process.

Notwithstanding the type of nitridation employed, the depth of the second nitridized metal surface layer 22R may vary. Typically, the depth of the second nitridized metal surface layer 22R, as measured from the topmost exposed surface of the second metal layer portion 18R inward, is from 0.5 nm to 20 nm, with a depth from 1 nm to 10 nm being more typical. As described above for the first nitridized metal surface layer 22L, this depth also determines the thickness of the second nitridized metal surface layer 22R.

In some embodiments, the second nitridized metal surface layer 22R has a bottommost surface that is coplanar with a bottommost surface of the first nitridized metal surface layer 22L. In such an embodiment, the topmost surface of the second nitridized metal surface layer 22R is coplanar with a topmost surface of the first nitridized metal surface layer 22L. In another embodiment, the second nitridized metal surface layer 22R has a bottommost surface that is not coplanar with a bottommost surface of the first nitridized metal surface layer 22L. In such an embodiment, the topmost surface of the second nitridized metal surface layer 22R is however coplanar with a topmost surface of the first nitridized metal surface layer 22L.

Collectively, the second metal portion 18R and the second nitridized metal surface layer 22R provide a second metal resistor structure of the present application. At this point of the present application, resistance measurements can be performed on the second metal resistor structure (18R, 22R). The resistance of the second metal resistor structure (18R, 22R) can be measured utilizing any conventional technique that is capable of measuring the resistance of a material or a material stack. In one example, a four point probe resistivity measurement can be used to measure the resistance of the second metal resistor structure (18R, 22R). In some embodiments and when the resistance measurements of the second metal resistor structure (18R, 22R) is not within a pre-determined range, trimming of the second metal resistor structure (18R, 22R) can be performed utilizing a patterning process. The steps of resistance measuring and trimming may be repeated any number of times to arrive at the pre-determined range.

The various trimming processes of the present application can make the first metal resistor structure to have a resistance (and hence resistivity) that is the same or different from the second metal resistor structure.

Figure 9:
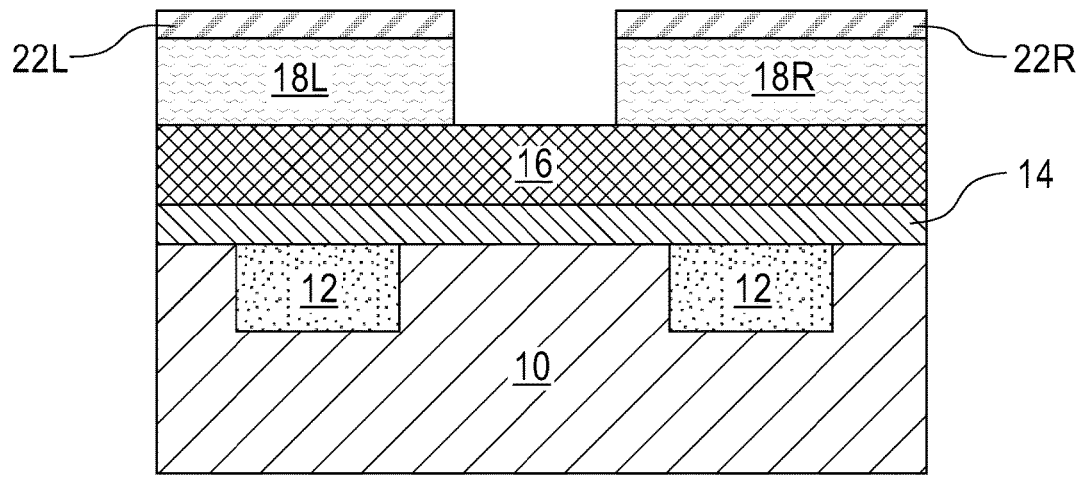
FIG. 9 is a cross sectional view of the exemplary semiconductor structure of FIG. 8 after removing the second block mask.

Referring now to FIG. 9, there is illustrated the exemplary semiconductor structure of FIG. 8 after removing the second block mask 24. The second block mask 24 may be removed utilizing one of the techniques mentioned above in removing the first block mask 20. When additional metal layer portions are formed, the above processing of mask formation, nitridation, resistance measuring of the resultant metal resistor structure, and trimming can be performed.

Figure 10:
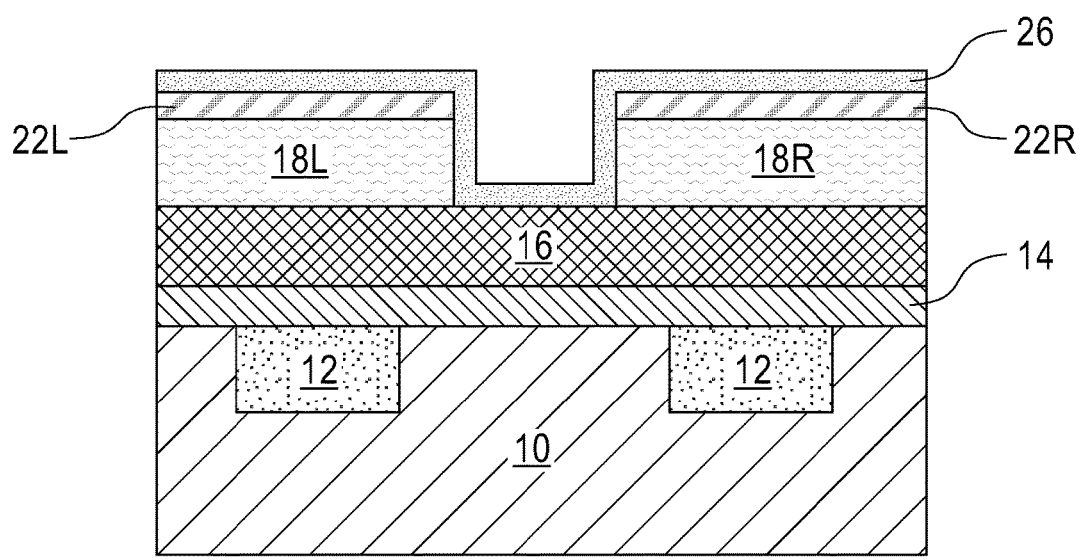
FIG. 10 is a cross sectional view of the exemplary semiconductor structure of FIG. 9 after forming a dielectric capping layer.

Referring now to FIG. 10, there is illustrated the exemplary semiconductor structure of FIG. 9 after forming a dielectric capping layer 26. The dielectric capping layer 26 used may include one of the dielectric capping materials mentioned above for the base dielectric capping layer 14. The dielectric capping layer 26 may be formed utilizing one of the deposition processes mentioned above in forming the base dielectric capping layer 14. The dielectric capping layer 26 may have a thickness in the range mentioned above for the base dielectric capping layer 14.

As is shown, the dielectric capping layer 26 is formed on exposed surfaces (topmost and sidewall surfaces) of the first metal resistor structure (18L, 22L), and on exposed surfaces (topmost and sidewall surfaces) of the second metal resistor structure (18R, 22R), and on the exposed surface of the dielectric stack (14, 16). In the present application, the various components of the first metal resistor structure (18L, 22L) are vertically aligned to each other, while the various components of the second metal resistor structure (18R, 22R) are vertically aligned with each other.

Figure 11:
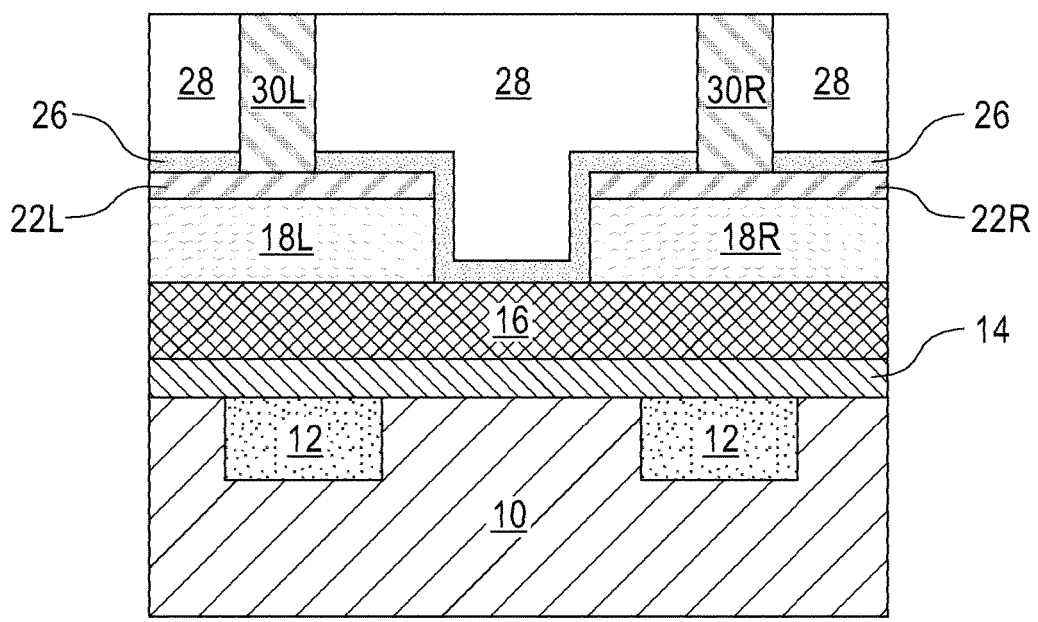
FIG. 11 is a cross sectional view of the exemplary semiconductor structure of FIG. 10 after forming a contact structure.

Referring now to FIG. 11, there is illustrated the exemplary semiconductor structure of FIG. 10 after forming a contact structure. Contact structure includes a dielectric material 28 that includes metal contact structures 30L, 30R embedded therein. Metal contact structure 30L extends through the dielectric material 28 and contacts a topmost surface of the first nitridized metal surface layer 22L (i.e., the topmost surface of the first metal resistor structure), while metal contact structure 30R extends through the dielectric material 28 and contacts a topmost surface of the second nitridized metal surface layer 22R (i.e., the topmost surface of the second metal resistor structure).

The dielectric material 28 may be composed of one of the dielectric materials mentioned above for the base interconnect dielectric material layer 10. In one embodiment, the dielectric material 28 may be composed of a same dielectric material as the base interconnect dielectric material layer 10. In another embodiment, the dielectric material 28 may be composed of a different dielectric material than the base interconnect dielectric material layer 10. The dielectric material 28 can be formed utilizing one of the techniques mentioned above for the base interconnect dielectric material layer 10. The thickness of the dielectric material 28 can also be within the range mentioned above for the base interconnect dielectric material layer 10. Typically, the thickness of the dielectric material 28 is greater than the thickness of the base interconnect dielectric material layer 10.

The metal contact structures 30L, 30R can include one of the conductive metals/metal alloys mentioned above for conductive regions 12. In one embodiment, the metal contact structures 30L, 30R may be composed of a same conductive metal/metal alloy as the conductive metal/metal alloy that provides the conductive region 12. In another embodiment, the metal contact structures 30L, 30R may comprise a different conductive material than the conductive material that provides the conductive regions 12. The metal contact structures 30L, 30R can be formed utilizing the same technique as mentioned above for forming the conductive regions 12. That is, lithography, etching and filling openings with a conductive material can be employed. In some embodiments, a diffusion barrier and a plating seed layer can be formed prior to filling the openings with the conductive metal/metal alloy. Following the filling of the openings with at least the conductive material, a planarization process can be performed in order to form the structure illustrated in FIG. 11.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a first metal resistor structure located on a portion of a dielectric-containing substrate, said first metal resistor structure comprises, from bottom to top, a first metal layer portion and a first nitridized metal surface layer having a first atomic percent nitrogen content; and
   a second metal resistor structure located on a second portion of said dielectric-containing substrate and spaced apart from said first metal resistor structure, wherein said second metal resistor structure comprises, from bottom to top, a second metal layer portion and a second nitridized metal surface layer having a second atomic percent nitrogen content that differs from said first atomic percent nitrogen content.

2. The semiconductor structure of claim 1, wherein said dielectric-containing substrate comprises, from bottom to top, a base interconnect dielectric material layer, a base dielectric capping layer, and an interconnect dielectric material layer, wherein said base interconnect dielectric material layer comprises at least one conductive region embedded therein.

3. The semiconductor structure of claim 1, wherein at least one of said first atomic percent nitrogen content and said second atomic percent nitrogen content is 10 atomic percent or greater.

4. The semiconductor structure of claim 1, wherein said first metal resistor structure has a different resistivity than said second metal resistor structure.

5. The semiconductor structure of claim 1, wherein a dielectric capping layer is present on said first metal resistor structure and said second metal resistor structure.

6. The semiconductor structure of claim 5, wherein a portion of the dielectric capping layer is present on sidewall surfaces of the first and second metal resistor structures, and contacting an exposed surface of said dielectric-containing substrate.

7. The semiconductor structure of claim 1, wherein said first nitridized metal surface layer, said first metal layer portion, said second nitridized metal surface layer and said second metal layer portion each comprises a same metal or metal alloy.

8. The semiconductor structure of claim 7, wherein said metal or metal alloy is selected from TaN, Ta, TiN, Ta, RuN, Ru, CoN, Co, WN, W, TaRuN and TaRu.

9. The semiconductor structure of claim 1, wherein sidewall surfaces of said first nitridized metal surface layer and said first metal layer portion are vertically aligned with each other, and wherein sidewall surfaces of said second nitridized metal surface layer and said second metal layer portion are vertically aligned with each other.

10. The semiconductor structure of claim 1, further comprising a contact structure formed surrounding said first and second metal resistor structures, wherein said contact structure includes metal contacts extending to a topmost surface of each of said first metal resistor structure and said second metal resistor structure.

11. A semiconductor structure comprising:
    a first metal resistor structure located on a portion of a dielectric-containing substrate, said first metal resistor structure comprises, from bottom to top, a first metal layer portion and a first nitridized metal surface layer having a first nitrogen content; and
    a second metal resistor structure located on a second portion of said dielectric-containing substrate and spaced apart from said first metal resistor structure, wherein said second metal resistor structure comprises, from bottom to top, a second metal layer portion and a second nitridized metal surface layer having a second nitrogen content that differs from said first nitrogen content, wherein each of said first and second metal layer portions is composed of at least one metal and is devoid of nitrogen.

* * * * *